US008803546B2

(12) United States Patent
Deng

(10) Patent No.: US 8,803,546 B2
(45) Date of Patent: Aug. 12, 2014

(54) METHOD FOR PERFORMING POWER DETECTION, AND ASSOCIATED APPARATUS

(75) Inventor: Zhiming Deng, San Jose, CA (US)

(73) Assignee: MediaTek Singapore Pte. Ltd., Singapore (SG)

( * ) Notice: Subject to any disclaimer, the term of this patent is extended or adjusted under 35 U.S.C. 154(b) by 481 days.

(21) Appl. No.: 13/304,673

(22) Filed: Nov. 27, 2011

(65) Prior Publication Data

US 2013/0134961 A1    May 30, 2013

(51) Int. Cl.
*G01R 35/00* (2006.01)
*G01R 21/12* (2006.01)
*G01R 35/04* (2006.01)

(52) U.S. Cl.
CPC ............. *G01R 21/12* (2013.01); *G01R 35/04* (2013.01)
USPC ........ 324/764.01; 324/126; 324/127; 324/74; 327/349

(58) Field of Classification Search
CPC ................................. G01R 21/12; G01R 35/04
USPC ................. 324/74, 126, 127, 764.01; 327/349
See application file for complete search history.

(56) References Cited

U.S. PATENT DOCUMENTS

| | | | | |
|---|---|---|---|---|
| 6,549,057 | B1 * | 4/2003 | Gilbert | 327/349 |
| 8,624,657 | B2 * | 1/2014 | Beale et al. | 327/349 |
| 2013/0107926 | A1 * | 5/2013 | Xia et al. | 375/224 |

OTHER PUBLICATIONS

Ullrich R. Pfeiffer, David Goren, "A 20 dBm Fully-Integrated 60 GHz SiGe Power Amplifier With Automatic Level Control", IEEE Journal of Solid-State Circuits, vol. 42, No. 7, Jul. 2007, pp. 1455-1463, IEEE, USA.
Jean Gorisse et al., "A 60GHz 65nm CMOS RMS Power Detector for Antenna Impedance Mismatch Detection", 2009, IEEE, USA.
Yijun Zhou, Michael Yan-Wah Chia, "A Low-Power Ultra-Wideband CMOS True RMS Power Detector", IEEE Transactions on Microwave Theory and Techniques, vol. 56, No. 5, May 2008, pp. 1052-1058, IEEE, USA.
Maxim Integrated Products, "Integrated DC Logarithmic Amplifiers", Application Note 3611, Sep. 23, 2005, www.maxim-ic.com/an3611, Maxim Integrated Products, USA.

* cited by examiner

*Primary Examiner* — Arleen M Vazquez
*Assistant Examiner* — Robert P Alejnikov, Jr.
(74) *Attorney, Agent, or Firm* — Winston Hsu; Scott Margo

(57) ABSTRACT

An apparatus for performing power detection includes a squarer module and a calibration module that is coupled to the squarer module, where the squarer module includes a first squarer and a second squarer. The first squarer is arranged to convert an input signal of the squarer module into a first squarer output signal. In addition, the second squarer is arranged to output a second squarer output signal while a predetermined voltage level is input into an input terminal of the second squarer. Additionally, the calibration module is arranged to compare a difference between the first squarer output signal and the second squarer output signal with a reference signal to generate a comparison signal, and to compensate the difference according to the comparison signal, so as to perform a calibration on the apparatus. A method for performing power detection is also provided, and can be performed by utilizing the apparatus.

20 Claims, 8 Drawing Sheets

METHOD FOR PERFORMING POWER DETECTION, AND ASSOCIATED APPARATUS

BACKGROUND

The present invention relates to power detection with calibration regarding mismatch, process, and voltage variation, and more particularly, to a method for performing power detection, and to an associated apparatus.

According to the related art, a metal oxide semiconductor (MOS) device biased in the saturation region acts as a squarer. The squarer can be utilized for power detection in wide-band applications. In a situation where the requirement of the power detection range is quite wide, some problems may occur. For example, an analog-to-digital converter (ADC) having a large dynamic range is typically required for a wide power detection range (e.g. a range that is greater than 20 dB) in the related art. As a result, associated costs are increased. Although other related art mechanisms are designed to avoid the need for an ADC having a large dynamic range, these mechanisms may suffer from various side effects due to their design, which degrades the overall performance. In conclusion, the related art does not serve the end user well. Thus, a novel method is required for enhancing power detection of an electronic device.

SUMMARY

It is therefore an objective of the claimed invention to provide a method for performing power detection, and to provide an associated apparatus, in order to solve the above-mentioned problems.

An exemplary embodiment of an apparatus for performing power detection comprises a squarer module and a calibration module that is coupled to the squarer module, where the squarer module comprises a first squarer and a second squarer. The first squarer is arranged to convert an input signal of the squarer module into a first squarer output signal, wherein the first squarer output signal comprises a static component and a variation component, and the variation component is proportional to a root mean square (RMS) value of the input signal. The second squarer is arranged to output a second squarer output signal while a predetermined voltage level is input into an input terminal of the second squarer. The calibration module is arranged to compare a difference between the first squarer output signal and the second squarer output signal with a reference signal to generate a comparison signal, and to compensate the difference according to the comparison signal, in order to perform a calibration on the apparatus.

An exemplary embodiment of a method for performing power detection is provided, where the method is performed by utilizing an apparatus comprising a squarer module, which comprises a first squarer arranged to convert an input signal of the squarer module into a first squarer output signal, and further comprises a second squarer arranged to output a second squarer output signal while a predetermined voltage level is input into an input terminal of the second squarer. The apparatus further comprises a calibration module arranged to perform a calibration on the mismatch between the first squarer and the second squarer. In details, a comparator is used as a difference sensor for the first squarer and the second squarer. According to the output signal of the comparator, a compensation signal is generated and controlled to compensate the difference between the two squarers. The method comprises the steps of: calibrating a mismatch difference between the static component of the first squarer output signal and the second squarer output signal; and then measuring a power level of the input signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
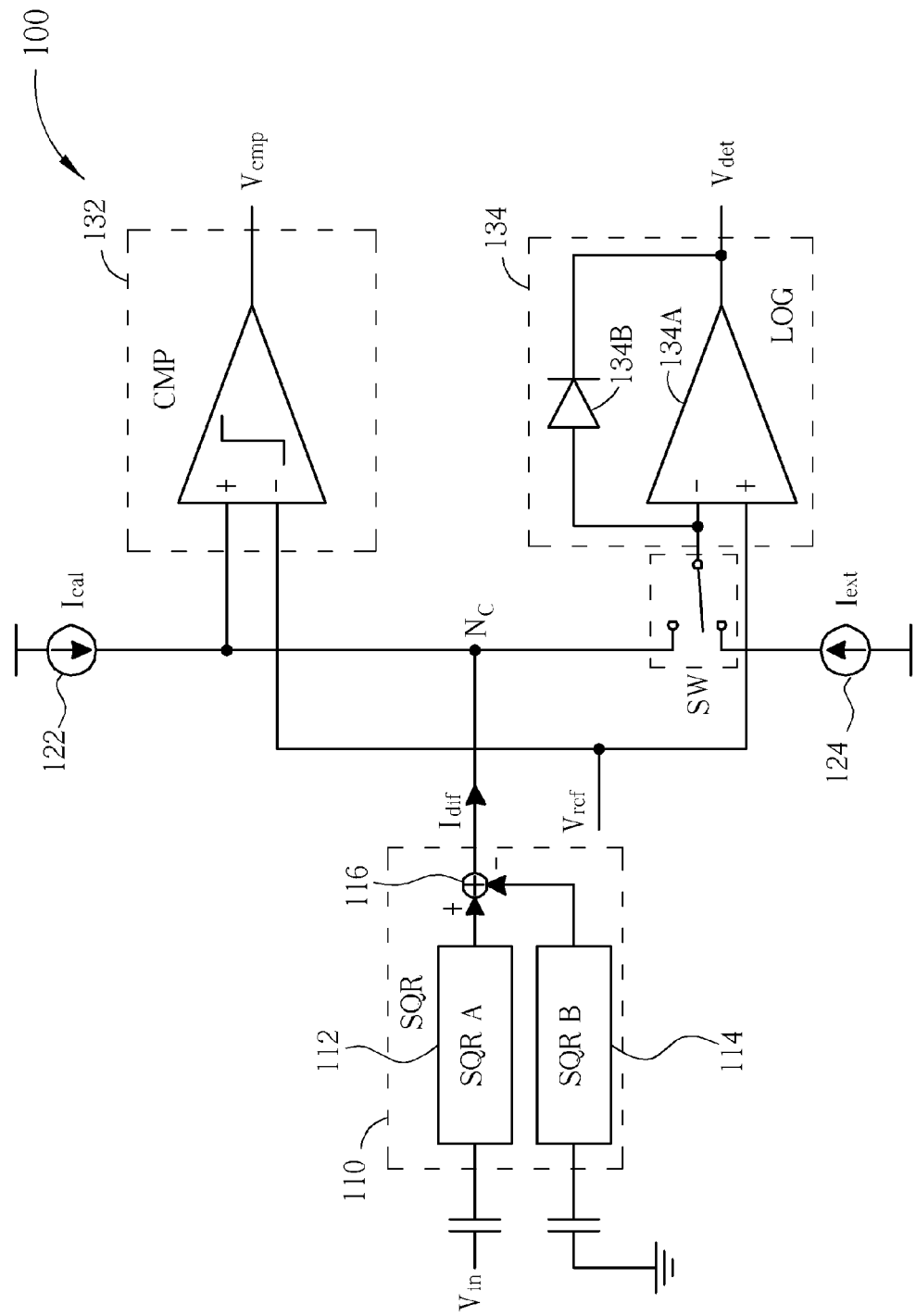
FIG. 1 is a diagram of an apparatus for performing power detection according to a first embodiment of the present invention.

Please refer to FIG. 1, which illustrates a diagram of an apparatus 100 for performing power detection according to a first embodiment of the present invention. The apparatus 100 comprises a squarer module 110 (labeled "SQR") and a calibration module that is coupled to the squarer module 110. As shown in FIG. 1, the squarer module 110 comprises a first squarer 112 and a second squarer 114 (labeled "SQR A" and "SQR B", respectively), and further comprises an arithmetic unit 116, where each of the first squarer 112 and the second squarer 114 can be implemented with a metal oxide semiconductor (MOS) device biased in the saturation region thereof, and the arithmetic unit 116 can be implemented with a subtraction unit. This is for illustrative purposes only, and is not meant to be a limitation of the present invention. According to some variations of this embodiment, the arithmetic unit 116 can be implemented with a combination of some circuits. As shown in FIG. 1, the calibration module of this embodiment comprises two current sources 122 and 124, whose currents are $I_{cal}$ and $I_{ext}$, respectively, and further comprises a switching unit SW, a comparator 132 (labeled "CMP"), and a transimpedance amplifier (TIA) such as a logarithmic circuit 134 (labeled "LOG"), where the logarithmic circuit 134 comprises an amplifier 134A and a diode 134B. Please note that two filters such as two capacitors are respectively installed at the input terminals of the first squarer 112 and the second squarer 114, for the purpose of filtering. For brevity, the two filters can temporarily be regarded as internal components of the first squarer 112 and the second squarer 114, respectively.

According to this embodiment, the first squarer 112 is arranged to convert an input signal $V_{in}$ of the squarer module 110 into a first squarer output signal (i.e. the squarer output signal that is received by the input terminal "+" of the arithmetic unit 116), where the first squarer output signal comprises a static component and a variation component, and the variation component is proportional to a root mean square (RMS) value of the input signal $V_{in}$. The second squarer 114 is arranged to output a second squarer output signal (i.e. the squarer output signal that is received by the input terminal "−" of the arithmetic unit 116) while a predetermined voltage level (which can be a ground voltage level in this embodiment) is input into the input terminal of the second squarer 114. The calibration module is arranged to compare a difference $I_{dif}$ between the first squarer output signal and the second squarer output signal with a reference signal $V_{ref}$ to generate a comparison signal $V_{cmp}$, and to compensate the difference $I_{dif}$ according to the comparison signal $V_{cmp}$, so as to perform a calibration on the apparatus 100. According to this embodiment, the static component mentioned above can be represented by a current signal. In particular, the static component mentioned above is a static current component, and the variation component is proportional to the RMS value of a voltage level of the input signal $V_{in}$.

As shown in FIG. 1, the current source 122 of this embodiment is connected to a central node $N_C$ for receiving the difference $I_{dif}$ mentioned above. The current source 122 is arranged to compensate the difference $I_{dif}$ according to the comparison signal $V_{cmp}$. More particularly, in some configuration of the apparatus 100 (e.g. the configuration illustrated with FIG. 3), the current source 122 is adjustable, where the calibration current $I_{cal}$ can properly be adjusted, so that the difference $I_{dif}$ can be compensated to make the total current flowing through the central node $N_C$ toward the switching unit SW be equal to zero in a situation where the input terminal of the first squarer 112 is temporarily arranged to receive the predetermined voltage level. As a result of properly adjusting the calibration current $I_{cal}$ to be a fixed value, the first squarer 112 and the second squarer 114 can be regarded as two components having exactly the same characteristics/responses, as if the first squarer 112 and the second squarer 114 are equivalent to each other. Regarding the current source 124, the current $I_{ext}$ thereof can be a fixed external current received from outside the apparatus 100. This is for illustrative purposes only, and is not meant to be a limitation of the present invention. According to some variations of this embodiment, the current $I_{ext}$ can be a fixed current generated within the apparatus 100. In general, no matter whether the source of the current $I_{ext}$ is, the current source 124 can be utilized for preventing malfunction of the TIA such as the logarithmic circuit 134 in some configurations of the apparatus 100.

In this embodiment, the comparator 132 is arranged to compare the difference $I_{dif}$ with the reference signal $V_{ref}$ to generate the comparison signal $V_{cmp}$. In addition, the TIA such as the logarithmic circuit 134 is arranged to perform the calibration in some configurations of the apparatus 100, and based upon the architecture shown in FIG. 1, the amplifier 134A is arranged to convert the difference $I_{dif}$ into a power detection signal $V_{det}$. Please note that the diode 134B is utilized in the TIA such as the logarithmic circuit 134. This is for illustrative purposes only, and is not meant to be a limitation of the present invention. According to some variations of this embodiment, the diode 134B can be replaced with an impedance component, where the amplifier 134A is arranged to convert the difference $I_{dif}$ into the power detection signal $V_{det}$ in a situation where an output terminal and an input terminal of the amplifier 134A are electronically connected to two terminals of the impedance component. For example, the impedance component can be a resistor whose two terminals are electronically connected to the output terminal and the input terminal of the amplifier 134A, respectively.

In practice, regarding the calibration module mentioned above, it should be clarified that the architecture formed with the squarer module 110 and the current source 122 can provide either a voltage output or a current output according to the connection of the switching unit SW (or the connection implemented with the switching operation performed by the switching unit SW). When mismatch calibration is performed for the first squarer 112 and the second squarer 114, the architecture formed with the squarer module 110 and the current source 122 provides the voltage output in a voltage mode, where the total current flowing through the central node $N_C$ toward the switching unit SW is forced to be zero due to the open circuit characteristic of this architecture. During the mismatch calibration, the comparator 132 compares the voltage level of the aforementioned voltage output (rather than the total current mentioned above) with the reference signal $V_{ref}$. When the power measurement mentioned in the descriptions of Step 220 is performed, the architecture formed with the squarer module 110 and the current source 122 provides the current output (i.e. the total current flowing through the central node $N_C$ toward the switching unit SW) in a current mode, where the voltage level at the central node $N_C$ is forced to be equal to that of the reference signal $V_{ref}$ since, during the power measurement, the non-reference input terminal of the TIA such as the logarithmic circuit 134 (e.g. the input terminal "−" of the amplifier 134A in this embodiment) is typically arranged to be electrically connected to the central node $N_C$ under control of the switching unit SW. Please note that the voltage levels of the two input terminals "+" and "−" of the amplifier 134A can be considered to be equal to each other due to the virtual ground characteristic thereof.

In some embodiments, the apparatus 100 is arranged to operate in one of a plurality of modes respectively corresponding to different configurations of the apparatus 100. In at least one of the modes, the apparatus 100 is arranged to perform the mismatch calibration, process calibration, and/or voltage variation calibration. For example, the apparatus 100 is arranged to perform mismatch calibration in one of the modes, to perform process calibration in another of the modes, and to perform voltage variation calibration in another of the modes.

Please note that the predetermined voltage level of this embodiment can be a ground voltage level. This is for illustrative purposes only, and is not meant to be a limitation of the present invention. According to some variations of this embodiment, the predetermined voltage level can be any fixed voltage level.

Figure 2:
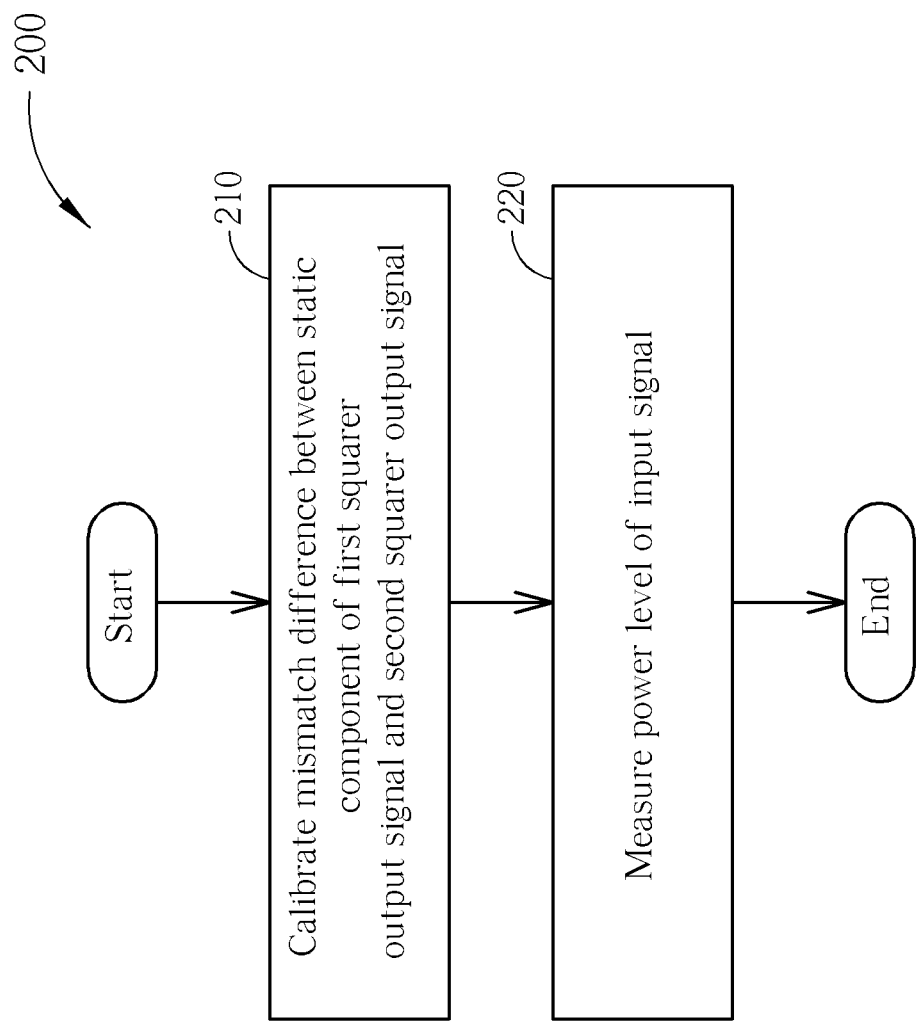
FIG. 2 illustrates a flowchart of a method for performing power detection according to an embodiment of the present invention.

FIG. 2 illustrates a flowchart of a method 200 for performing power detection according to an embodiment of the present invention. The method shown in FIG. 2 can be applied to the apparatus 100 shown in FIG. 1. The method is described as follows.

In Step 210, the apparatus 100 calibrates a mismatch difference between the static component of the first squarer output signal and the second squarer output signal, where the mismatch difference of this embodiment is a difference current. More particularly, the apparatus 100 can calibrate the mismatch difference by utilizing the current source 122, the comparator 132, and the associated control circuit (not shown in FIG. 1) that is capable of adjusting the calibration current $I_{cal}$ according to the comparison signal $V_{cmp}$. For example, in some configuration of the apparatus 100, the current source 122 is adjustable and the input terminal of the first squarer 112 is temporarily arranged to receive the predetermined voltage level, for the purpose of performing the mismatch calibration (i.e. the operation of calibrating the mismatch difference). Thus, Step 210 is performed in a situation where the variation component of the first squarer output signal is temporarily removed from the first squarer output signal, and more particularly, is performed in a situation where the static component remains in the first squarer output signal.

During the mismatch calibration, the control circuit adjusts the calibration current $I_{cal}$ according to the comparison signal $V_{cmp}$, so that the difference $I_{dif}$ can be compensated to make the total current flowing through the central node $N_C$ toward the switching unit SW be equal to zero in this configuration. As long as the resolution of the adjustment of the calibration current $I_{cal}$ is high enough, the total current flowing through the aforementioned central node $N_C$ may approach/reach zero in this configuration. After the mismatch difference is calibrated, the calibration current $I_{cal}$ is fixed, and then the apparatus 100 may switch to another configuration, in which the current source 122 becomes non-adjustable.

In Step 220, the apparatus 100 (more particularly, the aforementioned TIA such as the logarithmic circuit 134) measures a power level of the input signal $V_{in}$. For example, the apparatus 100 utilizes the aforementioned TIA (e.g. the logarithmic circuit 134) to perform mapping between the total current flowing through the central node $N_C$ toward the switching unit SW and the power detection signal $V_{det}$, and performs power measurement on the power detection signal $V_{det}$, in order to measure the power level of the input signal $V_{in}$.

Please note that, as a result of performing the mismatch calibration mentioned in the descriptions for Step 210, the total current flowing through the central node $N_C$ toward the switching unit SW can be regarded as the variation component of the first squarer output signal since the static component of the first squarer output signal is totally removed by subtracting the second squarer output signal from the first squarer output signal and by the compensation of the calibration current $I_{cal}$. Thus, after the mismatch calibration is performed, the total current flowing through the central node $N_C$ toward the switching unit SW becomes representative of the power of the input signal $V_{in}$, and is suitable for the measurement of the power of the input signal $V_{in}$. In addition, performing the mapping disclosed in Step 220 can avoid the use of an analog-to-digital converter (ADC) having a large dynamic range during the power measurement. As a result, related costs can be saved in contrast to the related art, without introducing any side effects.

Figure 4:
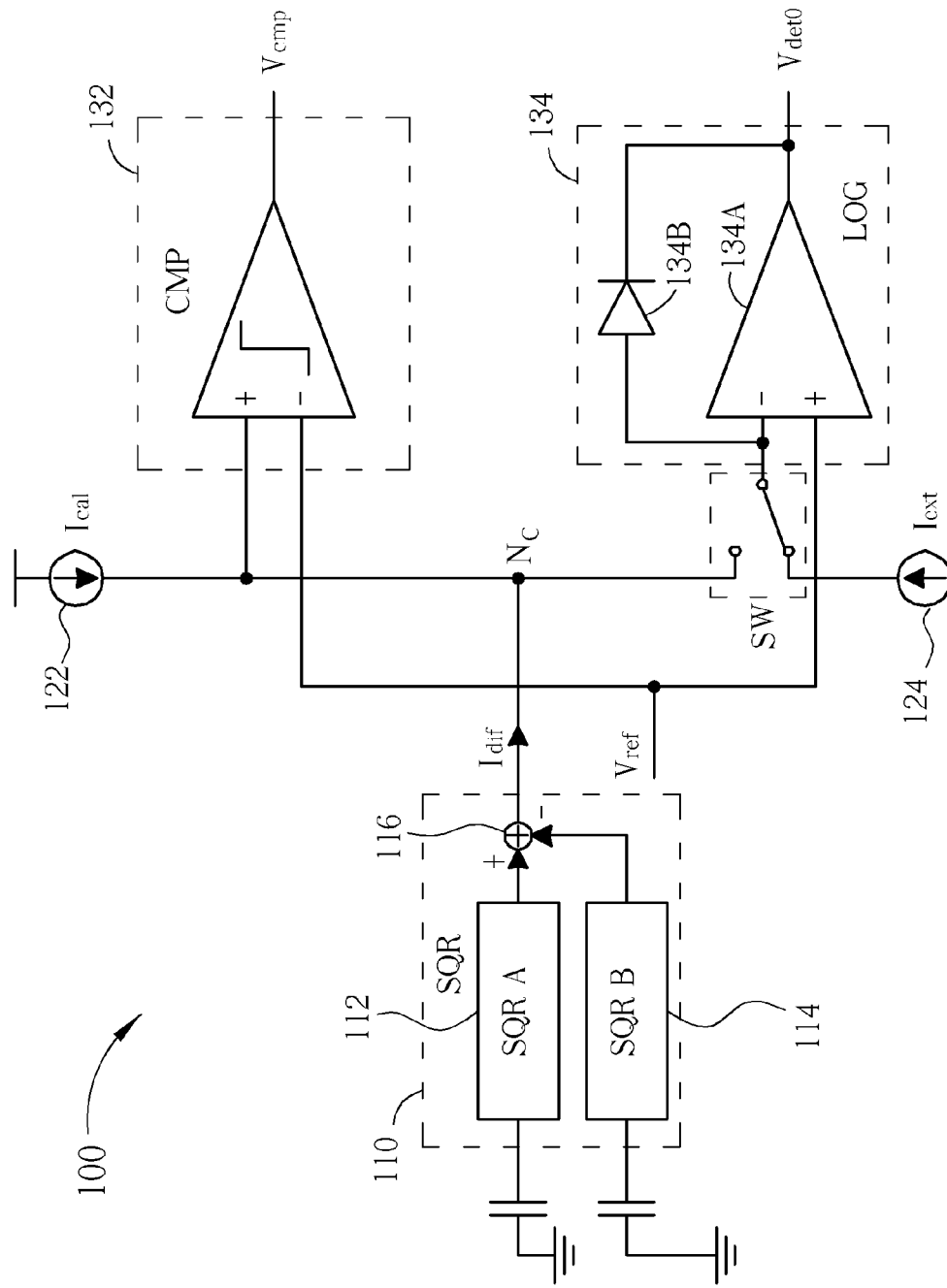
FIG. 4 illustrates a second configuration of the apparatus shown in FIG. 1, where the second configuration is utilized for performing offset characterization.

According to this embodiment, the apparatus 100 can further perform offset characterization regarding the aforementioned TIA such as the logarithmic circuit 134 to obtain a reference output voltage $V_{det0}$ which contains an unknown offset voltage that corresponds to the process variations of the TIA, where the reference output voltage $V_{det0}$ represents a voltage level of the power detection signal $V_{det}$; more particularly, the voltage level detected in some configuration of the apparatus 100 (e.g. the configuration illustrated with FIG. 4). Based upon the reference output voltage $V_{det0}$, the apparatus 100 can perform offset cancellation to obtain the power level of the input signal $V_{in}$, which greatly improves the accuracy of the power measurement.

Figure 3:
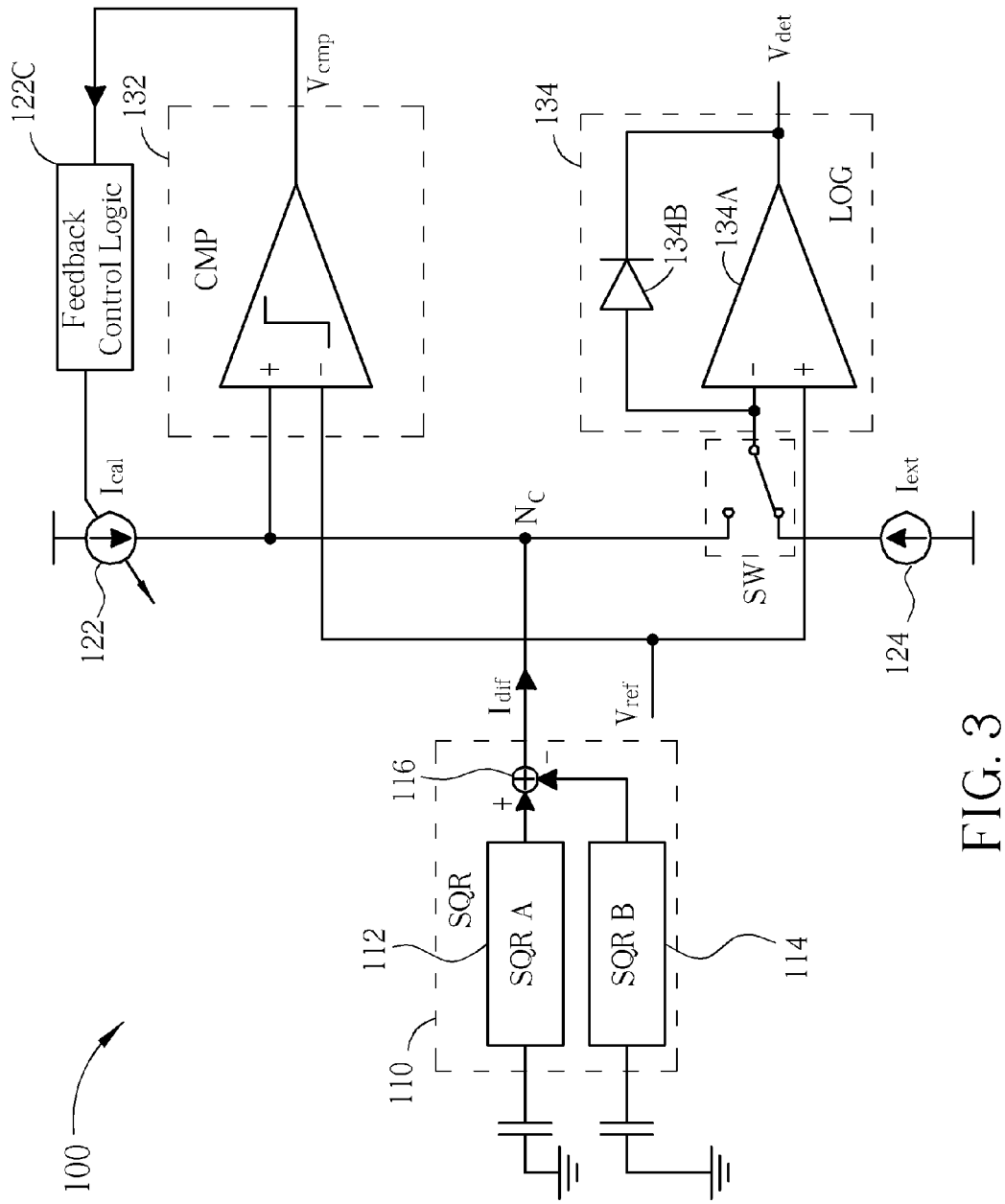
FIG. 3 illustrates a first configuration of the apparatus shown in FIG. 1, where the first configuration is utilized for performing mismatch calibration.

FIG. 3 illustrates a first configuration of the apparatus 100 shown in FIG. 1 according to an embodiment of the present invention, where the first configuration is utilized for performing the mismatch calibration. For better comprehension, the ground voltage level is taken as an example of the predetermined voltage level in this embodiment. In addition, the switching unit SW is arranged to electrically connect one of the two input terminals of the amplifier 134A (more particularly, the input terminal labeled "−" in this embodiment) to the current source 124, rather than the current source 122, in order to prevent inaccuracy of the mismatch calibration.

In the first configuration, the associated control circuit in the apparatus 100, such as the control circuit mentioned in the descriptions for Step 210, temporarily inputs the predetermined voltage level mentioned above into the input terminal of the first squarer 112 to remove the variation component from the first squarer output signal. As mentioned above (e.g., in the descriptions for Step 210), the mismatch difference is a difference current. In a situation where the variation component is removed from the first squarer output signal, the control circuit mentioned above (more particularly, the feedback control logic 122C within the control circuit) adjusts the current source 122 according to the comparison signal $V_{cmp}$ to make a summation of the difference current mentioned above and the calibration current $I_{cal}$ generated by the current source 122 approach (or be equal to) zero. Please note that this summation is the total current flowing through the central node $N_C$ toward the switching unit SW.

In practice, if the resolution of the adjustment of the calibration current $I_{cal}$ is not high enough, it may be difficult to reach the goal of making the total current flowing through the central node $N_C$ toward the switching unit SW be equal to zero in this configuration. As long as the resolution of the adjustment of the calibration current $I_{cal}$ is high enough, the total current flowing through the central node $N_C$ toward the switching unit SW may approach/reach zero in this configuration. Thus, it will be appreciated that, when the total current flowing through the central node $N_C$ toward the switching unit SW is equal to or less than the final increment/decrement for adjusting the calibration current $I_{cal}$ during the mismatch calibration, the goal of making the total current flowing through the central node $N_C$ toward the switching unit SW be equal to zero in this configuration can be considered to be reached.

As a result of adjusting the calibration current $I_{cal}$ according to the comparison signal $V_{cmp}$ by utilizing the feedback control logic 122C, the difference $I_{dif}$ can be compensated to make the total current flowing through the central node $N_C$ toward the switching unit SW approach (or be equal to) zero in the first configuration. Thus, the mismatch difference is calibrated and the calibration current $I_{cal}$ is fixed, and then the apparatus 100 may switch to another configuration, such as any of those respectively shown in FIG. 4 and FIG. 5.

FIG. 4 illustrates a second configuration of the apparatus 100 shown in FIG. 1 according to another embodiment of the present invention, where the second configuration is utilized for performing the offset characterization. For better comprehension, the ground voltage level is taken as an example of the predetermined voltage level in this embodiment.

In the second configuration, the apparatus 100 performs the offset characterization regarding the TIA (e.g. the logarithmic circuit 134) to obtain the reference output voltage $V_{det0}$ mentioned above. As shown in FIG. 4, the apparatus 100 temporarily configures an input terminal of the TIA such as the logarithmic circuit 134 (e.g. the input terminal "−" of the amplifier 134A) to receive a fixed current generated by a fixed current source, such as the current $I_{ext}$ generated by the current source 124. In a situation where the input terminal of the TIA (e.g. the input terminal "−" of the amplifier 134A) receives the fixed current such as the current $I_{ext}$, the apparatus 100 detects the output of the TIA and utilizes the output corresponding to the fixed current (i.e. the output of the TIA in a situation where the non-reference input thereof is the fixed current such as the current $I_{ext}$) as the reference output voltage $V_{det0}$.

In practice, an ADC within the apparatus 100 can be utilized for obtaining the digital value corresponding to the reference output voltage $V_{det0}$, where it is unnecessary for the ADC to have a large dynamic range since the logarithmic response of the TIA such as the logarithmic circuit 134 can cover a wide input range.

Please note that the reference output voltage $V_{det0}$ of this embodiment can be regarded as a reference output level, which can be obtained in a situation where the input of the TIA (e.g. the input terminal "−" of the amplifier 134A) is connected to the fixed current such as the current $I_{ext}$. In addition, the reference output voltage $V_{det0}$ includes not only the offset voltage but also the input information.

Figure 5:
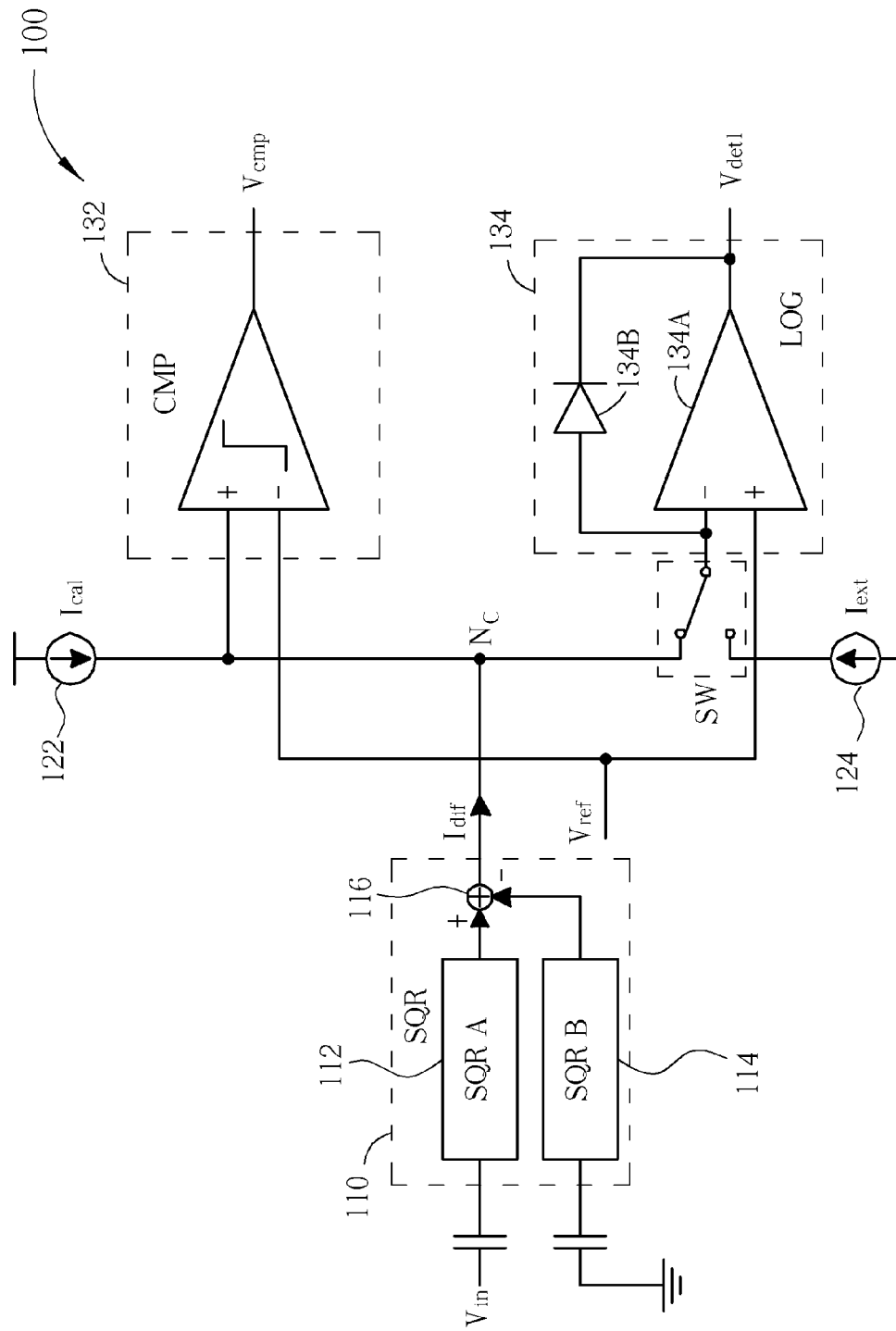
FIG. 5 illustrates a third configuration of the apparatus shown in FIG. 1, where the third configuration is utilized for performing power measurement.

FIG. 5 illustrates a third configuration of the apparatus 100 shown in FIG. 1 according to another embodiment of the present invention, where the third configuration is utilized for performing the power measurement. For better comprehension, the ground voltage level is taken as an example of the predetermined voltage level in this embodiment.

In the third configuration, the apparatus 100 temporarily configures the aforementioned input terminal of the TIA such as the logarithmic circuit 134 (e.g. the input terminal "−" of the amplifier 134A) to receive the difference $I_{dif}$, and therefore, to receive the total current passing through the central node $N_C$ toward the switching unit SW, where this total current is the total current of the difference $I_{dif}$ and the calibration current $I_{cal}$. In a situation where the input terminal of the TIA (e.g. the input terminal "−" of the amplifier 134A) receives the difference $I_{dif}$ (and more particularly, the total current mentioned above), the apparatus 100 detects the output of the TIA and utilizes the output corresponding to the difference $I_{dif}$ (i.e. the output of the TIA in a situation where the non-reference input thereof is the difference $I_{dif}$, and more particularly, the total current mentioned above) as a detected voltage $V_{det1}$, for obtaining the power level of the input signal $V_{in}$.

In practice, an ADC within the apparatus 100, such as that mentioned in the embodiment shown in FIG. 4, can be utilized for obtaining the digital value corresponding to the detected voltage $V_{det1}$.

According to an embodiment of the present invention, the apparatus 100 can perform data processing on the detected voltage $V_{det1}$, in order to accurately obtain the power level of the input signal $V_{in}$, where the first configuration, the second configuration, and the third configuration can be applied to the apparatus 100 of this embodiment in different modes thereof. In particular, the apparatus 100 performs the aforementioned offset cancellation on the detected voltage $V_{det1}$ according to the reference output voltage $V_{det0}$ to obtain the power level of the input signal $V_{in}$. For example, the apparatus 100 subtracts the reference output voltage $V_{det0}$ from the detected voltage $V_{det1}$ in the digital domain, and more particularly, subtracts the digital value corresponding to the reference output voltage $V_{det0}$ from the digital value corresponding to the detected voltage $V_{det1}$, in order to obtain the power level of the input signal $V_{in}$. As a result, the influence of the reference output voltage $V_{det0}$ corresponding to the process variation of the TIA can be removed from the power level that is eventually obtained.

In addition, the apparatus 100 of this embodiment utilizes an on-chip temperature sensor therein (not shown) to obtain temperature data of the apparatus 100, and performs temperature calibration according to the temperature data to obtain the power level of the input signal $V_{in}$. In practice, the apparatus 100 may be equipped with (or comprise) a look-up table indicating the relationship between the temperature and power level correction information (i.e. the correction information of the power level). For example, the look-up table may be stored in a memory device within the apparatus 100, and may comprise some correction factors respectively corresponding to some temperature values. As a result of performing the temperature calibration, the influence of the temperature can be removed from the power level that is eventually obtained.

In this embodiment, the apparatus 100 is arranged to perform the offset cancellation and the temperature calibration. This is for illustrative purposes only, and is not meant to be a limitation of the present invention. According to some variations of this embodiment, it is unnecessary to perform both of the offset cancellation and the temperature calibration. For example, during the data processing mentioned above, only the offset cancellation is performed. In another example, during the data processing mentioned above, only the temperature calibration is performed. In another example, both of the offset cancellation and the temperature calibration can be omitted.

Figure 6:
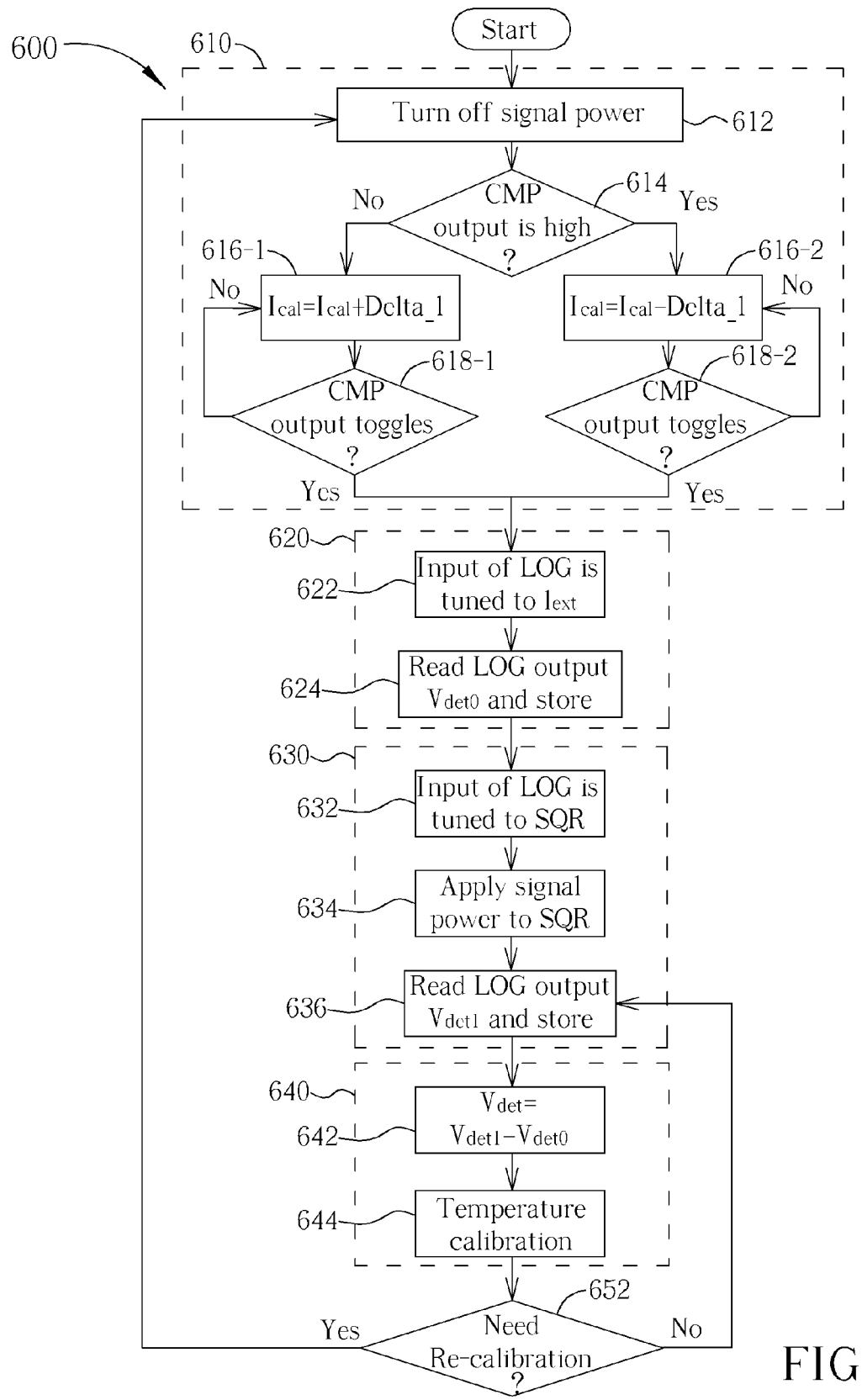
FIG. 6 illustrates a working flow involved with the method shown in FIG. 2 according to an embodiment of the present invention.

FIG. 6 illustrates a working flow 600 involved with the method 200 shown in FIG. 2 according to an embodiment of the present invention. The working flow 600 can be applied to the apparatus 100 shown in FIG. 1, and more particularly, the control circuit mentioned in the descriptions for Step 210. For example, the working flow 600 starts in a situation where the power of the apparatus 100 has just been turned on. In addition, there are multiple portions in the working flow 600, such as the portions 610, 620, 630, and 640 respectively corresponding to the mismatch calibration, the offset characterization, the power measurement, and the data processing mentioned above.

In Step 612, the apparatus 100 (more particularly, the control circuit mentioned in the embodiment shown in FIG. 3) turns off the signal power. For example, the control circuit temporarily inputs the predetermined voltage level mentioned above into the input terminal of the first squarer 112 to remove the variation component from the first squarer output signal.

In Step 614, the apparatus 100 determines whether the CMP output (i.e. the output of the comparator 132) is high. When it is detected that the CMP output is at a high level, Step 616-2 is entered; otherwise (i.e. the CMP output is at a low level), Step 616-1 is entered.

In Step 616-1, the apparatus 100 performs an operation corresponding to the following pseudo code:

$I_{cal}=I_{cal}+\text{Delta\_1}$;

The apparatus 100 increases the calibration current $I_{cal}$ with an increment whose magnitude is equal to a predetermined value Delta_1, where the predetermined value Delta_1 can be a real value that is small enough to achieve high accuracy of the mismatch calibration.

In Step 618-1, the apparatus 100 determines whether the CMP output (i.e. the output of the comparator 132) toggles, and more particularly, toggles from the low level to the high level. When it is detected that the CMP output toggles, Step 622 is entered; otherwise, Step 616-1 is re-entered.

In Step 616-2, the apparatus 100 performs an operation corresponding to the following pseudo code:

$$I_{cal}=I_{cal}-\text{Delta\_1};$$

The apparatus 100 decreases the calibration current $I_{cal}$ with a decrement whose magnitude is equal to the predetermined value Delta_1.

In Step 618-2, the apparatus 100 determines whether the CMP output (i.e. the output of the comparator 132) toggles, more particularly, from the high level to the low level. When it is detected that the CMP output toggles, Step 622 is entered; otherwise, Step 616-2 is re-entered.

In Step 622, the input of LOG, such as the non-reference input of the logarithmic circuit 134 (e.g. the input terminal "−" of the amplifier 134A), is turned to the current $I_{ext}$. More particularly, under control of the switching unit SW, the logarithmic circuit 134 receives the current $I_{ext}$ and utilizes the current $I_{ext}$ as the non-reference input of the logarithmic circuit 134.

In Step 624, the apparatus 100 reads the LOG output (i.e. the output of the logarithmic circuit 134) such as the reference output voltage $V_{det0}$ mentioned above and stores it. More particularly, the apparatus 100 utilizes the ADC mentioned in the embodiment shown in FIG. 4 to read the digital value corresponding to the reference output voltage $V_{det0}$ and then stores this digital value.

In Step 632, the input of LOG, such as the non-reference input of the logarithmic circuit 134 (e.g. the input terminal "−" of the amplifier 134A), is turned to SQR, i.e. the squarer module 110. More particularly, under control of the switching unit SW, the logarithmic circuit 134 receives the difference $I_{dif}$, and more particularly, the total current of the difference $I_{dif}$ and the calibration current $I_{cal}$. As a result, the logarithmic circuit 134 receives the total current mentioned above as the non-reference input of the logarithmic circuit 134.

In Step 634, the apparatus 100 applies the signal power to SQR, i.e. the squarer module 110. More specifically, the input signal $V_{in}$ (rather than the predetermined voltage level) is input into the input terminal of the first squarer 112.

In Step 636, the apparatus 100 reads the LOG output (i.e. the output of the logarithmic circuit 134) such as the detected voltage $V_{det1}$ mentioned above and stores it. More particularly, the apparatus 100 utilizes the ADC mentioned in the descriptions for Step 624 to read the digital value corresponding to the detected voltage $V_{det1}$ and then stores this digital value.

In Step 642, the apparatus 100 performs an operation corresponding to the following pseudo code:

$$V_{det}=V_{det1}-V_{det0};$$

The apparatus 100 performs the offset cancellation mentioned above to obtain an offset-free voltage level of the power detection signal $V_{det}$.

In Step 644, the apparatus 100 performs the temperature calibration mentioned above. As a result of performing the temperature calibration on the offset-free voltage level of the power detection signal $V_{det}$, the power level of the input signal $V_{in}$ can be accurately obtained.

In Step 652, the apparatus 100 determines whether re-calibration is needed. When it is detected that re-calibration is needed, Step 612 is re-entered; otherwise, Step 636 is re-entered to update the detected voltage $V_{det1}$, in order to accurately measure the power level of the input signal $V_{in}$ in real time.

Figure 7:
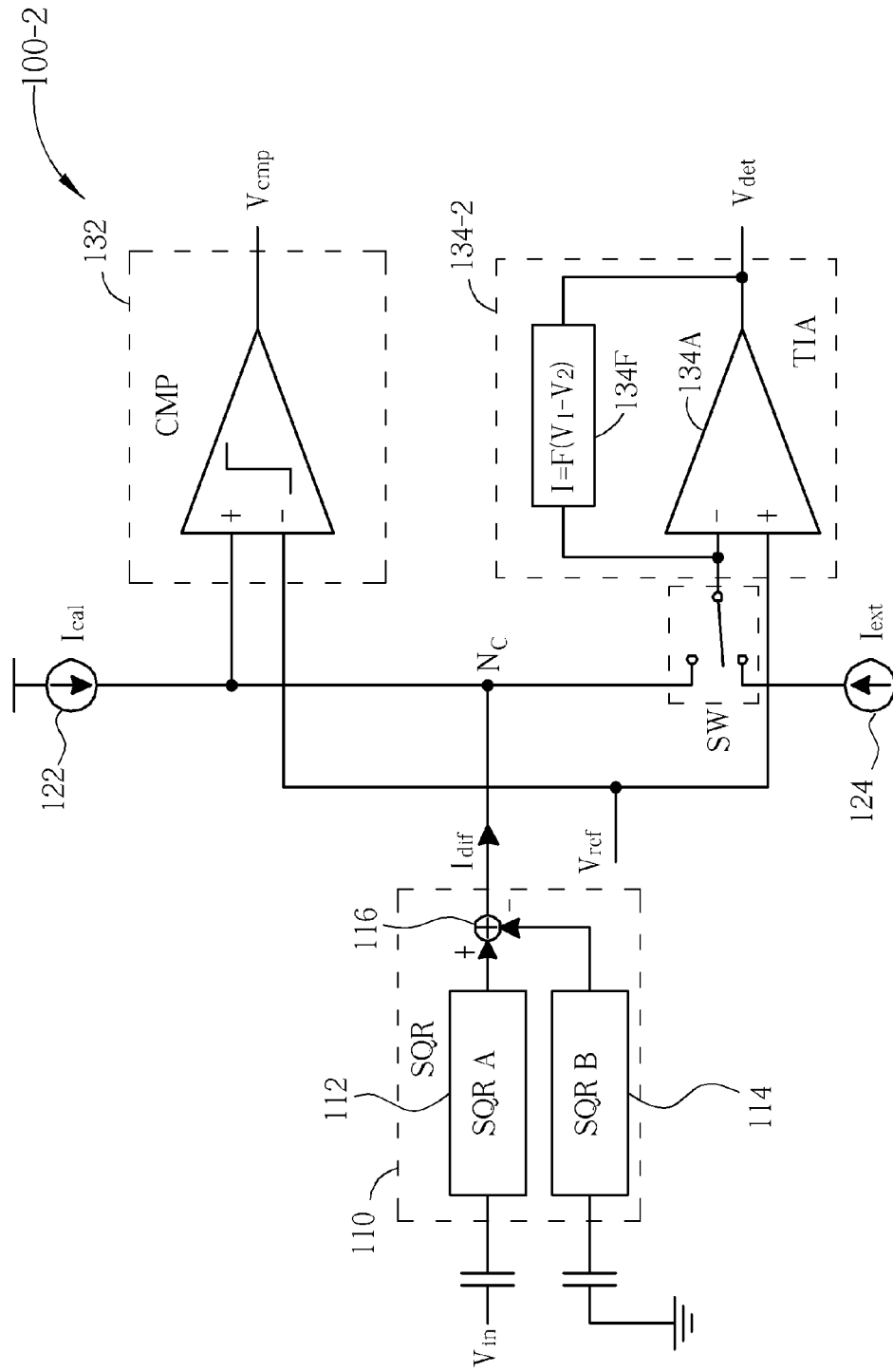
FIG. 7 is a diagram of an apparatus for performing power detection according to a second embodiment of the present invention.

FIG. 7 is a diagram of an apparatus 100-2 for performing power detection according to a second embodiment of the present invention. In comparison with the embodiment shown in FIG. 1, the logarithmic circuit 134 is replaced with the TIA 134-2, where the diode 134B is replaced with the impedance component 134F.

According to this embodiment, the impedance component 134F in the TIA 134-2 provides the TIA 134-2 with the characteristic corresponding to the following equation:

$$I=F(V_1-V_2);$$

where the notation F represents a function, the notation I represents the current flowing through the impedance component 134F, and the notations $V_1$ and $V_2$ represent the voltage levels at the input terminal "−" and the output terminal of the amplifier 134A, respectively. For example, the impedance component 134F can be a resistor such as that mentioned above.

Based upon the architecture shown in FIG. 7, the amplifier 134A is arranged to convert the difference $I_{dif}$ into the power detection signal $V_{det}$ in a situation where the output terminal and the input terminal "−" of the amplifier 134A are electronically connected to the two terminals of the impedance component 134F, where the input terminal "+" of the amplifier 134A is arranged to receive the reference signal $V_{ref}$. In addition, the switching unit SW is arranged to selectively input the difference $I_{dif}$ or a fixed signal such as the current $I_{ext}$ into the input terminal "−" of the amplifier 134A, so that the TIA can be utilized in different configurations as disclosed above. Similar descriptions for this embodiment are not repeated in detail here.

Figure 8:
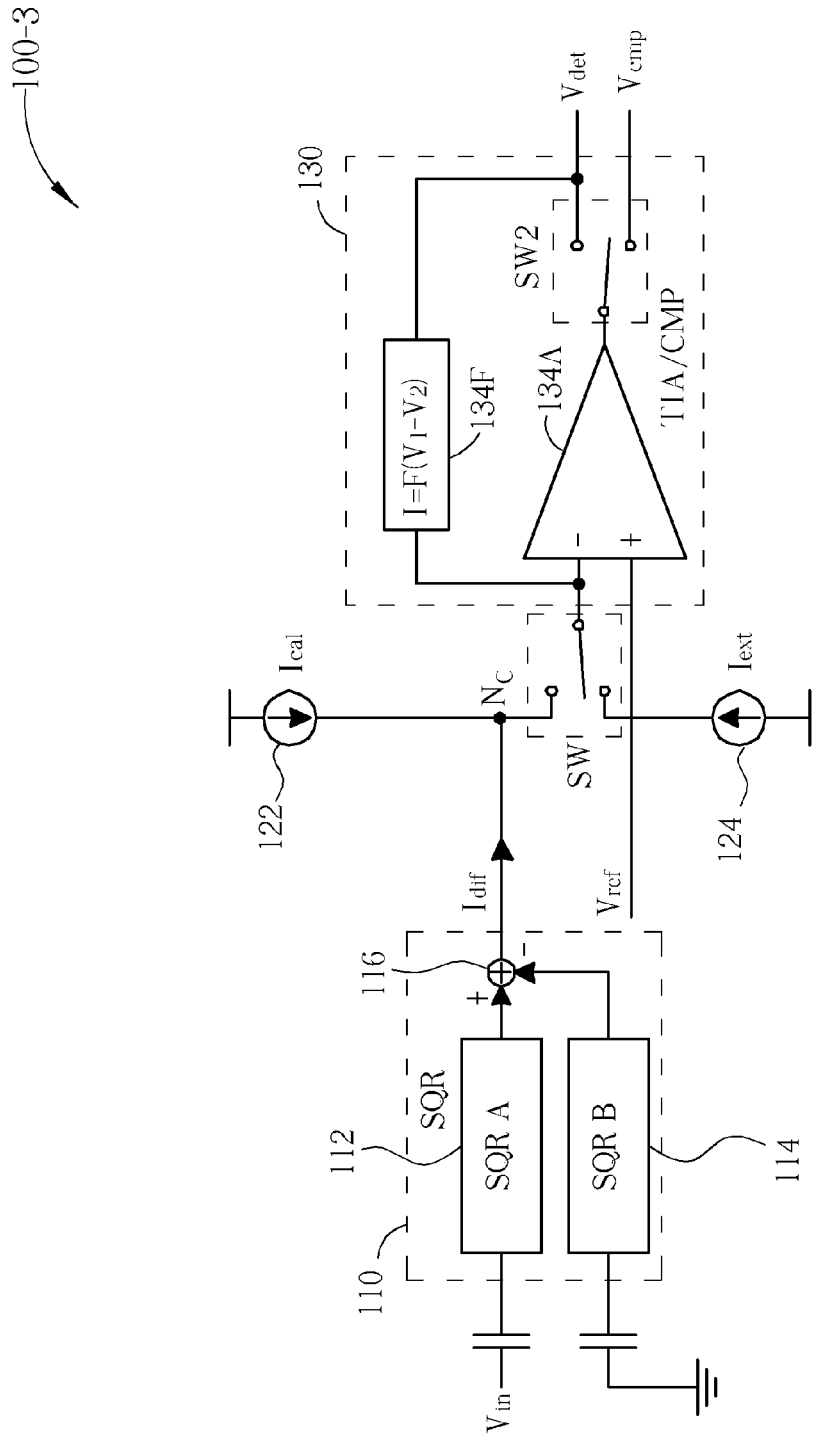
FIG. 8 is a diagram of an apparatus for performing power detection according to a third embodiment of the present invention.

FIG. 8 is a diagram of an apparatus 100-3 for performing power detection according to a third embodiment of the present invention. The calibration module of this embodiment comprises a TIA/comparator composite circuit 130, which can be referred to as the TIA/CMP for brevity, where the comparator 132 and the TIA 134-2 shown in FIG. 7 are integrated into the same circuit in this embodiment, i.e. the TIA/CMP 130 shown in FIG. 8.

As shown in FIG. 8, the TIA/CMP 130 comprises the switching unit SW2, allowing the TIA/CMP 130 to be utilized as the comparator 132 and/or the TIA 134-2 shown in FIG. 7. For example, under control of the switching unit SW2, the output terminal of the amplifier 134A can be electrically connected to the upper right output terminal of the TIA/CMP 130 (i.e. the terminal for outputting the power detection signal $V_{det}$) when needed, and therefore, the TIA/CMP 130 can be regarded as the TIA 134-2 shown in FIG. 7 in this situation. In another example, under control of the switching unit SW2, the output terminal of the amplifier 134A can be electrically connected to the lower right output terminal of the TIA/CMP 130 (i.e. the terminal for outputting the comparison signal $V_{cmp}$) when needed, and therefore the switching unit SW2 is arranged to configure the TIA 134-2 to be the comparator 132. Similar descriptions for this embodiment are not repeated in detail here.

It is an advantage of the present invention that the present invention method and apparatus do not need an ADC having a large dynamic range while no side effect is introduced, and therefore the architecture in any of the embodiments/variations disclosed above is suitable for power detection in wideband applications. In addition, the present invention method and apparatus can accurately determine the mismatch difference of the squarer module (more particularly, the mismatch difference between the static component of the first squarer output signal and the second squarer output signal), and can completely remove the influence of the mismatch difference. Additionally, the present invention method and apparatus can accurately determine the offset voltage corresponding to process variation of the TIA, and can completely remove the influence of the process variation of the TIA. As a result, the related art problems are overcome.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus for performing power detection, the apparatus comprising:
  a squarer module comprising:
    a first squarer arranged to convert an input signal of the squarer module into a first squarer output signal, wherein the first squarer output signal comprises a static component and a variation component, and the variation component is proportional to a root mean square (RMS) value of the input signal; and
    a second squarer arranged to output a second squarer output signal while a predetermined voltage level is input into an input terminal of the second squarer; and
  a calibration module, coupled to the squarer module, arranged to compare a difference between the first squarer output signal and the second squarer output signal with a reference signal to generate a comparison signal, and to compensate the difference according to the comparison signal, so as to perform a calibration on the apparatus.

2. The apparatus of claim 1, wherein the static component is represented by a current signal.

3. The apparatus of claim 1, wherein the variation component is proportional to the RMS value of a voltage level of the input signal.

4. The apparatus of claim 1, wherein the calibration module comprises:
  a comparator arranged to compare the difference with the reference signal to generate the comparison signal.

5. The apparatus of claim 1, wherein the calibration module comprises:
  a current source arranged to compensate the difference according to the comparison signal.

6. The apparatus of claim 1, wherein the calibration module comprises:
  a comparator arranged to compare the difference with the reference signal to generate the comparison signal;
  a current source arranged to compensate the difference according to the comparison signal; and
  a transimpedance amplifier (TIA) arranged to perform the calibration.

7. The apparatus of claim 1, wherein the calibration module comprises:
  a current source arranged to compensate the difference according to the comparison signal;
  a transimpedance amplifier (TIA) arranged to perform the calibration; and
  a switching unit arranged to configure the TIA to be a comparator, wherein the comparator is arranged to compare the difference with the reference signal to generate the comparison signal.

8. The apparatus of claim 1, wherein the calibration module comprises a transimpedance amplifier (TIA) arranged to perform the calibration; and the TIA comprises:
  an impedance component; and
  an amplifier arranged to convert the difference into a power detection signal in a situation where an output terminal and an input terminal of the amplifier are electronically connected to two terminals of the impedance component.

9. The apparatus of claim 8, further comprising:
  a switching unit arranged to selectively input the difference or a fixed signal into the input terminal of the amplifier.

10. The apparatus of claim 9, wherein another input terminal of the amplifier is arranged to receive the reference signal.

11. The apparatus of claim 1, wherein the apparatus is arranged to operate in one of a plurality of modes; and in at least one of the modes, the apparatus is arranged to perform mismatch calibration, process calibration, and/or voltage variation calibration.

12. A method for performing power detection, the power detection being performed by utilizing an apparatus comprising a squarer module, which comprises a first squarer arranged to convert an input signal of the squarer module into a first squarer output signal, and further comprises a second squarer arranged to output a second squarer output signal while a predetermined voltage level is input into an input terminal of the second squarer, the apparatus further comprising a calibration module arranged to compare a difference between the first squarer output signal and the second squarer output signal with a reference signal to generate a comparison signal, and to compensate the difference according to the comparison signal, so as to perform a calibration on the apparatus, the method comprising the steps of:
  calibrating a mismatch difference between a static component of the first squarer output signal and the second squarer output signal; and
  after the step of calibrating, measuring a power level of the input signal.

13. The method of claim 12, wherein the step of calibrating the mismatch difference is performed in a situation where a variation component of the first squarer output signal is temporarily removed from the first squarer output signal.

14. The method of claim 13, wherein the step of calibrating the mismatch difference is performed in a situation where the static component remains in the first squarer output signal.

15. The method of claim 12, wherein the static component is represented by a current signal, and the mismatch difference is a difference current; and the step of calibrating the mismatch difference further comprises:
  temporarily inputting the predetermined voltage level into an input terminal of the first squarer to remove the variation component from the first squarer output signal; and
  when the variation component is removed from the first squarer output signal, adjusting a current source according to the comparison signal to make a summation of the difference current and a calibration current generated by the current source approach zero.

16. The method of claim 12, wherein the step of measuring the power level further comprises:
  temporarily configuring an input terminal of a transimpedance amplifier (TIA) to receive the difference; and
  when the input terminal of the TIA receives the difference, detecting an output of the TIA and utilizing the output corresponding to the difference as a detected voltage, for use of obtaining the power level.

17. The method of claim 16, further comprising:
  performing offset characterization regarding a transimpedance amplifier (TIA) to obtain an offset voltage corresponding to process variation of the TIA; and performing offset cancellation on the detected voltage according to the offset voltage to obtain the power level of the input signal.

18. The method of claim 17, wherein the step of performing the offset characterization further comprises:

temporarily configuring an input terminal of the TIA to receive a fixed current generated by a fixed current source; and when the input terminal of the TIA receives the fixed current, detecting an output of the TIA and utilizing the output corresponding to the fixed current as the offset voltage.

19. The method of claim 17, wherein the step of performing the offset cancellation further comprises:

subtracting the offset voltage from the detected voltage to obtain the power level of the input signal.

20. The method of claim 12, further comprising:

utilizing an on-chip temperature sensor to obtain temperature data of the apparatus; and performing temperature calibration according to the temperature data to obtain the power level of the input signal.

* * * * *